US009721672B1

(12) United States Patent
Dutta et al.

(10) Patent No.: US 9,721,672 B1

(45) Date of Patent: Aug. 1, 2017

(54) MULTI-DIE PROGRAMMING WITH DIE-JUMPING INDUCED PERIODIC DELAYS

(71) Applicant: SANDISK TECHNOLOGIES INC., Plano, TX (US)

(72) Inventors: Deepanshu Dutta, Fremont, CA (US); Arash Hazeghi, Emeryville, CA (US); Huai-Yuan Tseng, San Ramon, CA (US); Cynthia Hsu, Milpitas, CA (US); Navneeth Kankani, Fremont, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 22 days.

(21) Appl. No.: 15/099,781

(22) Filed: Apr. 15, 2016

(51) Int. Cl.

| | |
|---|---|
| ***G11C 16/32*** | (2006.01) |
| ***G11C 16/34*** | (2006.01) |
| ***G11C 16/04*** | (2006.01) |

(52) U.S. Cl.
CPC ...... *G11C 16/3459* (2013.01); *G11C 16/0483* (2013.01); *G11C 16/32* (2013.01)

(58) Field of Classification Search
CPC .. G11C 16/3459; G11C 16/32; G11C 16/0483
See application file for complete search history.

(56) References Cited

U.S. PATENT DOCUMENTS

| | | | | |
|---|---|---|---|---|
| 7,778,083 | B2 | 8/2010 | Moon | |
| 7,940,567 | B2 | 5/2011 | Moon | |
| 8,223,556 | B2 | 7/2012 | Dutta | |
| 8,228,741 | B2 | 7/2012 | Li | |
| 8,879,330 | B1 | 11/2014 | Mu | |
| 9,019,745 | B1 * | 4/2015 | Cheng | G11C 13/0064 365/148 |
| 9,159,412 | B1 | 10/2015 | Hung | |

* cited by examiner

*Primary Examiner* — Douglas King
(74) *Attorney, Agent, or Firm* — Vierra Magen Marcus LLP

(57) ABSTRACT

Systems and methods for improving the reliability of data stored in memory cells are described. To mitigate the effects of trapped electrons after one or more programming pulses have been applied to memory cells, a delay between the one or more programming pulses and subsequent program verify pulses may be set based on a chip temperature, the number of the one or more programming pulses that were applied to the memory cells, and/or the programming voltage that was applied to the memory cells during the one or more programming pulses. To mitigate the effects of residual electrons after one or more program verify pulses have been applied to memory cells, a delay between the one or more program verify pulses and subsequent programming pulses may be set based on a chip temperature and/or the programming voltage to be applied to the memory cells during the subsequent programming pulses.

16 Claims, 12 Drawing Sheets

MULTI-DIE PROGRAMMING WITH DIE-JUMPING INDUCED PERIODIC DELAYS

BACKGROUND

Semiconductor memory is widely used in various electronic devices such as cellular telephones, digital cameras, personal digital assistants, medical electronics, mobile computing devices, and non-mobile computing devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory) and Electrically Erasable Programmable Read-Only Memory (EEPROM).

Both flash memory and EEPROM utilize floating-gate transistors. For each floating-gate transistor, a floating gate is positioned above and insulated from a channel region of the floating-gate transistor. The channel region is positioned between source and drain regions of the floating-gate transistor. A control gate is positioned above and insulated from the floating gate. The threshold voltage of the floating-gate transistor may be controlled by setting the amount of charge stored on the floating gate. The amount of charge on the floating gate is typically controlled using Fowler-Nordheim tunneling or hot-electron injection. The ability to adjust the threshold voltage allows a floating-gate transistor to act as a non-volatile storage element or memory cell. In some cases, more than one data bit per memory cell (i.e., a multi-level or multi-state memory cell) may be provided by programming and reading multiple threshold voltages or threshold voltage ranges.

NAND flash memory structures typically arrange multiple floating-gate transistors in series with and between two select gates. The floating-gate transistors in series and the select gates may be referred to as a NAND string. In recent years, NAND flash memory has been scaled in order to reduce cost per bit. However, as process geometries shrink, many design and process challenges are presented. These challenges include increased variability in transistor characteristics over process, voltage, and temperature variations.

DETAILED DESCRIPTION

Figure 1:
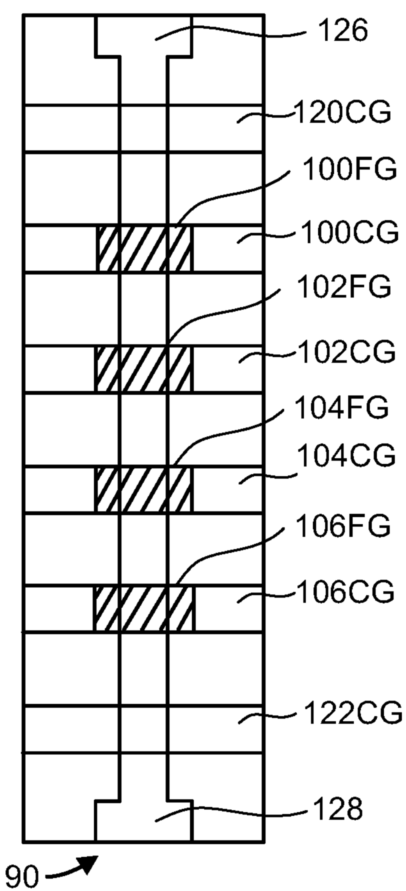
FIG. 1 depicts one embodiment of a NAND string.

Technology is described for improving data retention and reliability of data stored in memory cells within a memory array. The memory array may comprise various memory structures including planar NAND structures, vertical NAND structures, Bit Cost Scalable (BiCS) NAND structures, 3D NAND structures, or 3D ReRAM structures. In some cases, to mitigate the effects of residual electrons after one or more program verify pulses have been applied to memory cells, a delay between the one or more program verify pulses and subsequent programming pulses may be set and/or adjusted based on a chip temperature, the number of subsequent programming pulses to be applied to the memory cells, or the programming voltage to be applied to the memory cells during the subsequent programming pulses. In one example, the delay between the one or more program verify pulses and subsequent programming pulses may be increased by at least a particular amount if a chip temperature is below a temperature threshold, if the number of programming pulses to be applied to the memory cells is greater than a particular number, and/or if the programming voltage to be applied to the memory cells is above a voltage level. To mitigate the effects of trapped electrons after one or more programming pulses have been applied to memory cells, a delay between the one or more programming pulses and subsequent program verify pulses may be set and/or adjusted based on a chip temperature, the number of the one or more programming pulses that were applied to the memory cells, or the programming voltage that was applied to the memory cells during the one or more programming pulses. In one example, the delay between the one or more programming pulses and subsequent program verify pulses may be increased by at least a particular amount if a chip temperature is below a temperature threshold, if the number of the one or more programming pulses that were applied to the memory cells was greater than a particular number, and/or if the programming voltage applied to the memory cells during the one or more programming pulses was above a voltage level.

In some cases, after a program verify operation or a read operation has been performed, electrons within an inverted polysilicon channel of a NAND string formed during the program verify operation or the read operation may become trapped at polysilicon grain boundaries and require additional time to recombine. These residual electrons may degrade channel boosting during a subsequent programming operation. In some cases, electrons may recombine more quickly at higher temperatures and therefore there may be a greater number of residual electrons affecting subsequent programming operations at lower chip temperatures (e.g., below 25 degrees Celsius). Adding a delay between a program verify operation (e.g., comprising one or more program verify pulses) and a subsequent programming operation (e.g., comprising one or more programming pulses) may allow a larger number of residual electrons to recombine and improve channel boosting during the subsequent programming operation.

In some cases, during a programming operation, electrons may get trapped within shallow trap sites within a charge trapping layer (e.g., a silicon nitride layer). The charge trapping layer may be part of a charge trapping Flash transistor or a vertical charge trapping NAND structure. These trapped electrons may de-trap after a subsequent program verify operation to verify the programming operation leading to an uncompensated reduction in transistor threshold voltage. In some cases, the trapped electrons may be freed more quickly at higher temperatures and therefore there may be a greater number of trapped electrons that de-trap after program verify at lower chip temperatures (e.g., below 10 degrees Celsius). Adding a delay between a programming operation and a subsequent program verify operation may allow a larger number of trapped electrons to de-trap prior to performing the subsequent program verify operation.

To increase system-level programming throughput and reduce the system-level performance penalty due to additional delays being added between application of programming pulses and program verify pulses to memory cells, the memory cells within a system may be partitioned into a plurality of segments or a plurality of groups of memory cells and the application of programming pulses and program verify pulses may be alternated between the different groupings of memory cells. In one example, a first set of memory die (e.g., 16 memory die) may apply a first set of programming pulses to a first set of memory cells associated with the first set of memory die and then a second set of memory die (e.g., another 16 memory die) may apply a second set of programming pulses to a second set of memory cells associated with the second set of memory die. Subsequently, the first set of memory die may apply a first set of program verify pulses to the first set of memory cells and then the second set of memory die may apply a second set of program verify pulses to the second set of memory cells. In this case, the system-level performance penalty due to the delay between the application of the first set of programming pulses to the first set of memory cells and the application of the first set of program verify pulses to the first set of memory cells may be reduced or minimized by applying the second set of programming pulses to the second set of memory cells during the delay. Moreover, the system-level performance penalty due to delay between the application of the first set of program verify pulses to the first set of memory cells and the subsequent application of a third set of programming pulses to the first set of memory cells may be reduced by applying the second set of program verify pulses to the second set of memory cells during the delay between the application of the first set of program verify pulses to the first set of memory cells and the subsequent application of the third set of programming pulses to the first set of memory cells.

In another example, a first set of memory arrays (e.g., a first memory array) may apply a first set of programming pulses to a first set of memory cells associated with the first set of memory arrays and then a second set of memory arrays (e.g., a second memory array) may apply a second set of programming pulses to a second set of memory cells associated with the second set of memory arrays. Subsequently, the first set of memory arrays may apply a first set of program verify pulses to the first set of memory cells and then the second set of memory arrays may apply a second set of program verify pulses to the second set of memory cells.

In one embodiment, a non-volatile storage system may include one or more two-dimensional arrays of non-volatile memory cells. The memory cells within a two-dimensional memory array may form a single layer of memory cells and may be selected via control lines (e.g., word lines and bit lines) in the X and Y directions. In another embodiment, a non-volatile storage system may include one or more monolithic three-dimensional memory arrays in which two or more layers of memory cells may be formed above a single substrate without any intervening substrates. In some cases, a three-dimensional memory array may include one or more vertical columns of memory cells located above and orthogonal to a substrate or substantially orthogonal to the substrate (e.g., within 2-5 degrees of a normal vector that is orthogonal to the substrate). In one example, a non-volatile storage system may include a memory array with vertical bit lines or bit lines that are arranged orthogonal to a semiconductor substrate. The substrate may comprise a silicon substrate. The memory array may comprise various memory structures including planar NAND structures, vertical NAND structures, Bit Cost Scalable (BiCS) NAND structures, 3D NAND structures, or 3D ReRAM structures.

In one embodiment, the memory cells within a memory array may comprise re-writable non-volatile memory cells including a reversible resistance-switching element. A reversible resistance-switching element may include a reversible resistivity-switching material having a resistivity that may be reversibly switched between two or more states. In one embodiment, the reversible resistance-switching material may include a metal oxide (e.g., a binary metal oxide). The metal oxide may include nickel oxide or hafnium oxide. In another embodiment, the reversible resistance-switching material may include a phase change material. The phase change material may include a chalcogenide material. In some cases, the re-writeable non-volatile memory cells may comprise resistive RAM (ReRAM) memory cells. In other cases, the re-writeable non-volatile memory cells may comprise conductive bridge memory cells or programmable metallization memory cells.

In some embodiments, a non-volatile storage system may include a non-volatile memory that is monolithically formed in one or more physical levels of arrays of memory cells having an active area disposed above a silicon substrate. The non-volatile storage system may also include circuitry associated with the operation of the memory cells (e.g., decoders, state machines, page registers, or control circuitry for controlling the reading or programming of the memory cells). The circuitry associated with the operation of the memory cells may be located above the substrate or located within the substrate.

In some embodiments, a non-volatile storage system may include a monolithic three-dimensional memory array. The monolithic three-dimensional memory array may include one or more levels of memory cells. Each memory cell within a first level of the one or more levels of memory cells may include an active area that is located above a substrate (e.g., above a single-crystal substrate or a crystalline silicon substrate). In one example, the active area may include a semiconductor junction (e.g., a P-N junction). The active area may include a portion of a source or drain region of a transistor. In another example, the active area may include a channel region of a transistor.

Figure 2:
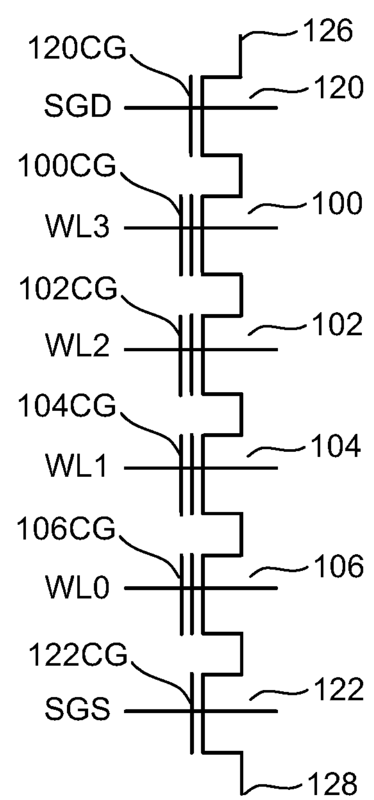
FIG. 2 depicts one embodiment of the NAND string of FIG. 1 using a corresponding circuit diagram.

FIG. 1 depicts one embodiment of a NAND string 90. FIG. 2 depicts one embodiment of the NAND string of FIG. 1 using a corresponding circuit diagram. As depicted, NAND string 90 includes four transistors, 100, 102, 104, and 106, in series between a first select gate 120 (i.e., a drain-side select gate) and a second select gate 122 (i.e., a source-side select gate). Select gate 120 connects the NAND string 90 to a bit line 126. Select gate 122 connects the NAND string 90 to a source line 128. Select gate 120 is controlled by applying the appropriate voltage to control gate 120CG (i.e., via select line SGD of FIG. 2). Select gate 122 is controlled by applying the appropriate voltage to control gate 122CG (i.e., via select line SGS of FIG. 2). Each of the transistors 100, 102, 104, and 106 includes a control gate and a floating gate. For example, transistor 100 includes control gate 100CG and floating gate 100FG, transistor 102 includes control gate 102CG and floating gate 102FG, transistor 104 includes control gate 104CG and floating gate 104FG, and transistor 106 includes control gate 106CG and floating gate 106FG. Control gates 100CG, 102CG, 104CG, and 106CG are connected to word lines WL3, WL2, WL1, and WL0, respectively.

Note that although FIGS. 1 and 2 show four floating-gate transistors in the NAND string, the use of four floating-gate transistors is only provided as an example. A NAND string may have less than or more than four floating-gate transistors (or memory cells). For example, some NAND strings may include 16 memory cells, 32 memory cells, 64 memory cells, 128 memory cells, etc. The discussion herein is not limited to any particular number of memory cells in a NAND string. One embodiment uses NAND strings with 66 memory cells, where 64 memory cells are used to store data and two of the memory cells are referred to as dummy memory cells because they do not store data.

A typical architecture for a flash memory system using a NAND flash memory structure includes a plurality of NAND strings within a memory block. A memory block may comprise a unit of erase. In some cases, the NAND strings within a memory block may share a common well (e.g., a P-well). Each NAND string may be connected to a common source line by its source-side select gate (e.g., controlled by select line SGS) and connected to its associated bit line by its drain-side select gate (e.g., controlled by select line SGD). Typically, each bit line runs on top of (or over) its associated NAND string in a direction perpendicular to the word lines and is connected to a sense amplifier.

In some embodiments, during a programming operation, storage elements that are not to be programmed (e.g., storage elements that have previously completed programming to a target data state) may be inhibited or locked out from programming by boosting associated channel regions (e.g., self-boosting the channel regions via word line coupling). An unselected storage element (or unselected NAND string) may be referred to as an inhibited or locked out storage element (or inhibited NAND string) as it is inhibited or locked out from programming during a given programming iteration of a programming operation.

Although technology using NAND-type flash memory is described herein, the technology disclosed herein may also be applied to other types of non-volatile storage devices and architectures (e.g., NOR-type flash memory). Moreover, although technology using floating-gate transistors is described herein, the technology described herein may also be applied to or used with other memory technologies including those that employ charge trapping, phase-change (e.g., chalcogenide materials), or state-change materials.

Figure 3A:
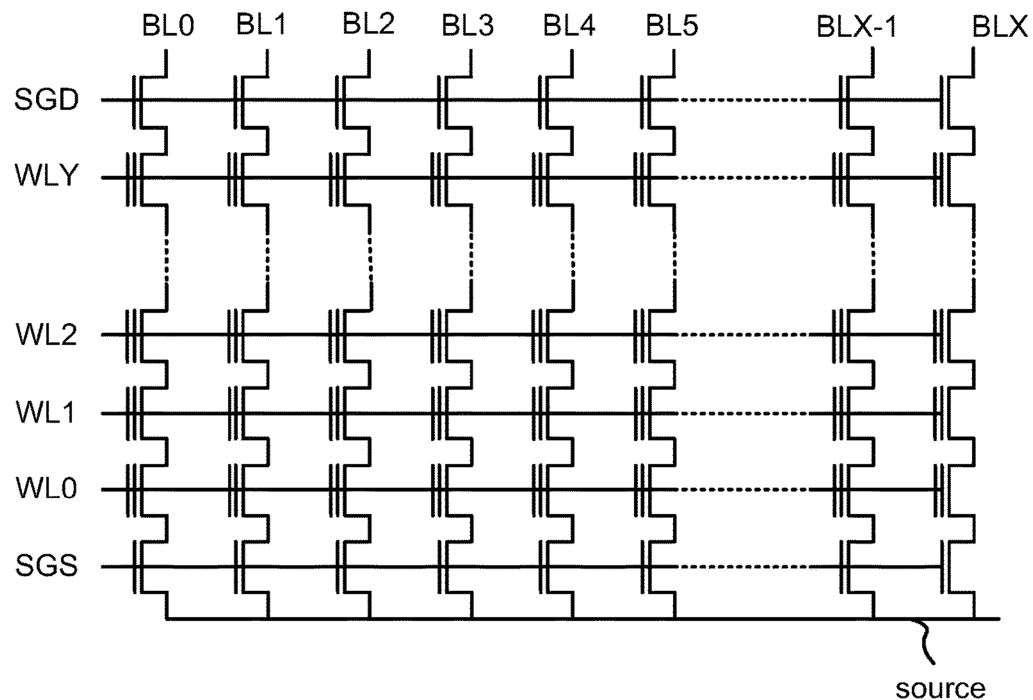
FIG. 3A depicts one embodiment of a memory block including a plurality of NAND strings.

FIG. 3A depicts one embodiment of a memory block including a plurality of NAND strings. As depicted, each NAND string includes (Y+1) memory cells. Each NAND string is connected to one bit line out of (X+1) bit lines on the drain side (i.e., one bit line of bit lines BL0-BLX) via a drain-side select gate controlled by the drain-side selection signal SGD. Each NAND string is connected to a source line (source) via a source-side select gate controlled by source-side selection signal SGS. In one embodiment, the source-side select gate controlled by source-side selection signal SGS and the drain-side select gate controlled by the drain-side selection signal SGD may comprise transistors without floating gates or transistors that include a floating gate structure. In some embodiments, the transistors within a NAND string may comprise transistors with a charge trapping layer.

In one embodiment, during a programming operation, when programming a memory cell, such as a NAND flash memory cell, a program voltage may be applied to the control gate of the memory cell and the corresponding bit line may be grounded. These programming bias conditions may cause electrons to be injected into the floating gate (or into a charge storage layer, such as a silicon nitride charge trapping layer) via field-assisted electron tunneling, thereby raising the threshold voltage of the memory cell. The program voltage applied to the control gate during a program operation may be applied as a series of pulses. In some cases, the magnitude of the programming pulses may be increased with each successive pulse by a predetermined step size. Between programming pulses, one or more verify operations may be performed. During the programming operation, memory cells that have reached their intended programming states may be locked out and inhibited from programming by boosting the channel regions of the program inhibited memory cells.

In one embodiment, memory cells may be erased by raising the p-well to an erase voltage (e.g., 20 volts) for a sufficient period of time and grounding the word lines of a selected block of memory cells while the source and bit lines are floating. In the case of a vertical memory device (e.g., BiCS or other type of 3D NAND), the vertical channel in the memory string may be electrically connected to the substrate (e.g., via a p-well in the substrate) at the bottom of the memory hole (e.g., located below the SGS transistor). These erase bias conditions may cause electrons to be transferred from the floating gate through the tunneling oxide, thereby lowering the threshold voltage of the memory cells within the selected block. In some cases, an erase operation may be performed on an entire memory plane, on individual blocks within a memory plane, or another unit of memory cells.

In some embodiments, during verify operations and/or read operations, a selected word line may be connected (or biased) to a voltage, a level of which is specified for each read and verify operation in order to determine whether a threshold voltage of a particular memory cell has reached such level. After applying the word line voltage, the conduction current of the memory cell may be measured (or sensed) to determine whether the memory cell conducted a sufficient amount of current in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell.

There are many ways to measure the conduction current of a memory cell during a read or verify operation. In one example, the conduction current of a memory cell may be measured by the rate it discharges or charges a dedicated capacitor in a sense amplifier. In another example, the conduction current of the selected memory cell allows (or fails to allow) the NAND string that included the memory cell to discharge a voltage on the corresponding bit line. The voltage of the bit line (or the voltage across a dedicated capacitor in a sense amplifier) may be measured after a period of time to determine whether the bit line has been discharged by a particular amount or not.

Figure 3B:
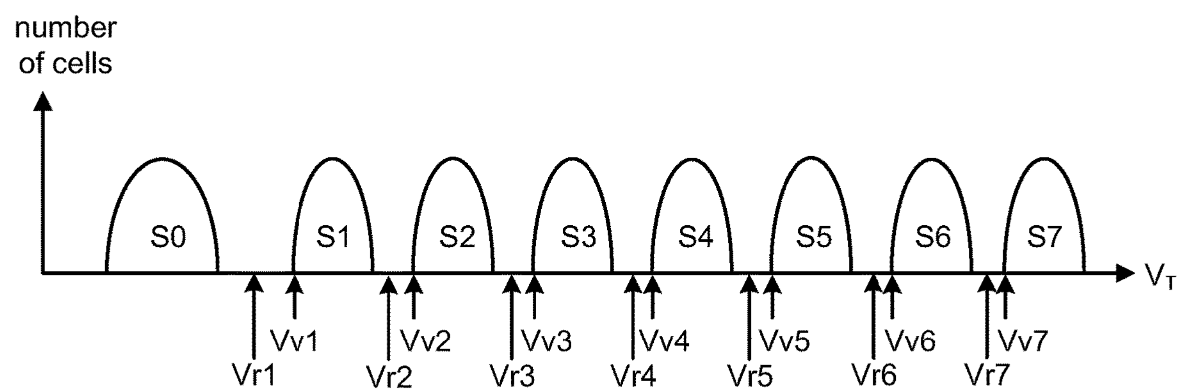
FIG. 3B depicts one embodiment of possible threshold voltage distributions for a three-bit-per-cell memory cell.

FIG. 3B depicts one embodiment of possible threshold voltage distributions (or data states) for a three-bit-per-cell memory cell (i.e., the memory cell may store three bits of data). Other embodiments, however, may use more than or less than three bits of data per memory cell (e.g., such as four or more bits of data per memory cell). At the end of a successful programming process (with verification), the threshold voltages of memory cells within a memory page or memory block should be within one or more threshold voltage distributions for programmed memory cells or within a distribution of threshold voltages for erased memory cells, as appropriate.

As depicted, each memory cell may store three bits of data; therefore, there are eight valid data states S0-S7. In one embodiment, data state S0 is below 0 volts and data states S1-S7 are above 0 volts. In other embodiments, all eight data states are above 0 volts, or other arrangements can be implemented. In one embodiment, the threshold voltage distribution S0 is wider than distributions S1-S7.

Each data state S0-S7 corresponds to a unique value for the three bits stored in the memory cell. In one embodiment, S0=111, S1=110, S2=101, S3=100, S4=011, S5=010, S6=001 and S7=000. Other mappings of data to states S0-S7 can also be used. In one embodiment, all of the bits of data stored in a memory cell are stored in the same logical page. In other embodiments, each bit of data stored in a memory cell corresponds to different pages. Thus, a memory cell storing three bits of data would include data in a first page, a second page, and a third page. In some embodiments, all of the memory cells connected to the same word line would store data in the same three pages of data. In some embodiments, the memory cells connected to a word line can be grouped into different sets of pages (e.g., by odd and even bit lines).

In some cases, the memory cells may be erased to state S0. From state S0, the memory cells may be programmed to any of states S1-S7. Programming may be performed by applying a set of pulses with rising magnitudes to the control gates of the memory cells. Between pulses, a set of verify operations may be performed to determine whether the memory cells being programmed have reached their target threshold voltage (e.g., using verify levels Vv1, Vv2, Vv3, Vv4, Vv5, Vv6, and Vv7). Memory cells being programmed to state S1 will be tested to see if their threshold voltage has reached Vv1. Memory cells being programmed to state S2 will be tested to see if their threshold voltage has reached Vv2. Memory cells being programmed to state S3 will be tested to see if their threshold voltage has reached Vv3. Memory cells being programmed to state S4 will be tested to see if their threshold voltage has reached Vv4. Memory cells being programmed to state S5 will be tested to see if their threshold voltage has reached Vv5. Memory cells being programmed to state S6 will be tested to see if their threshold voltage has reached Vv6. Memory cells being programmed to state S7 will be tested to see if their threshold voltage has reached Vv7.

When reading memory cells that store three bits of data, multiple reads will be performed at read compare points Vr1, Vr2, Vr3, Vr4, Vr5, Vr6, and Vr7 to determine which state the memory cells are in. If a memory cell turns on in response to Vr1, then it is in state S0. If a memory cell turns on in response to Vr2 but does not turn on in response to Vr1, then it is in state S1. If a memory cell turns on in response to Vr3 but does not turn on in response to Vr2, then it is in state S2. If a memory cell turns on in response to Vr4 but does not turn on in response to Vr3, then it is in state S3. If a memory cell turns on in response to Vr5 but does not turn on in response to Vr4, then it is in state S4. If a memory cell turns on in response to Vr6 but does not turn on in response to Vr5, then it is in state S5. If a memory cell turns on in response to Vr7 but does not turn on in response to Vr6, then it is in state S6. If a memory cell does not turn on in response to Vr7, then it is in state S7.

Figure 3C:
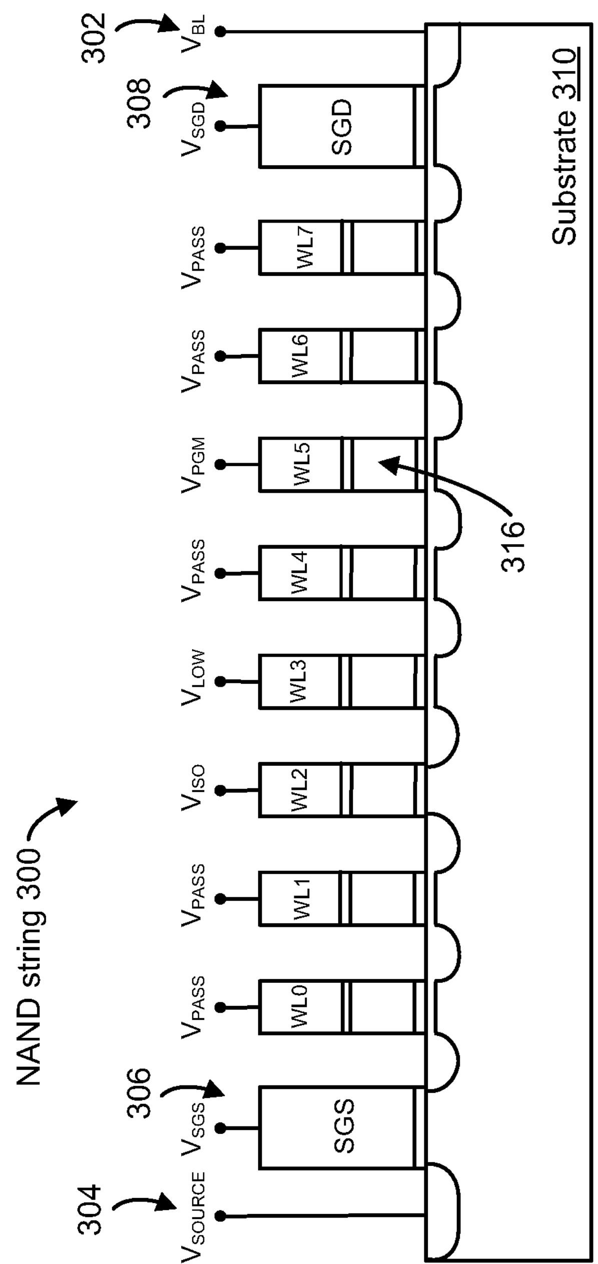
FIG. 3C depicts one embodiment of a NAND string during a programming operation.

FIG. 3C depicts one embodiment of a NAND string 300 during a programming operation. When programming a storage element (e.g., the storage element 316 associated with WL5) of the NAND string 300, a programming voltage may be applied to the selected word line associated with the storage element and a low voltage (e.g., ground) may be applied to the bit line associated with the storage element. As depicted, the NAND string 300 includes a source-side select gate 306, a drain-side select gate 308, and eight word lines WL0-WL7 formed above a p-well 310. $V_{SGS}$ may be applied to the source-side select gate 306 and $V_{SGD}$ may be applied to the drain-side select gate 308. The bit line 302 may be biased to $V_{BL}$ and the source line 304 may be biased to $V_{SOURCE}$. During a programming operation, a programming voltage, $V_{PGM}$, may be applied to selected word line WL5, which is associated with a selected storage element 316.

In one example of a boosting mode, when storage element 316 is the selected storage element, a relatively low voltage, $V_{LOW}$ (e.g., 2-6V) may be applied to a source-side word line (WL3), while an isolation voltage, $V_{ISO}$ (e.g., 0-4V) may be applied to another source-side word line (WL2), referred to as an isolation word line and a pass voltage, $V_{PASS}$, may be applied to the remaining word lines associated with NAND string 300 (in this case word lines WL0, WL1, WL4, WL6, and WL7). While the absolute values of $V_{ISO}$ and $V_{LOW}$ may vary over a relatively large and partly overlapping range, $V_{ISO}$ may be less than $V_{LOW}$. In some cases, $V_{ISO}$ may be less than $V_{LOW}$ which is less than $V_{PASS}$ which is less than $V_{PGM}$.

FIG. 3D depicts one embodiment of a NAND string 300 during an erase operation. The p-well 310 may be biased to an erase voltage (e.g., 20V) during the erase operation while selected word lines corresponding with memory cells to be erased are biased to 0V. The erase operation may comprise a partial block erase operation as only the storage elements connected to word lines WL5-WL6 are being erased, while all other storage elements connected to word lines WL0-WL4 and WL7 are not being erased. The nodes corresponding with $V_{BL}$, $V_{SOURCE}$, $V_{SGS}$, and $V_{SGD}$ may also be floated during the erase operation.

Figure 4A:
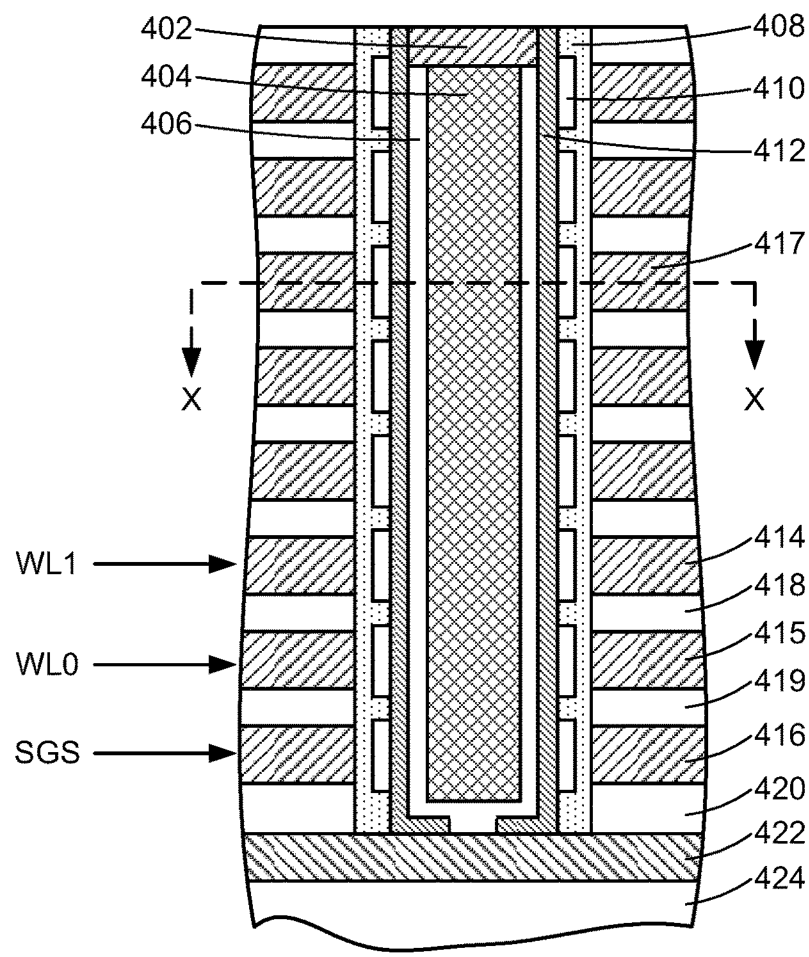
FIG. 4A depicts one embodiment of a vertical NAND structure.

FIG. 4A depicts one embodiment of a vertical NAND structure. The vertical NAND structure includes a vertical NAND string formed above the substrate 424 and oriented such that the vertical NAND string is orthogonal to the substrate 424. The vertical NAND string may be arranged within a vertical memory hole that is etched through alternating layers of control gate material (e.g., tungsten or polysilicon) and inter-gate insulator material (e.g., oxide or silicon oxide). As depicted, the layers of control gate material include layer 417 and layers 414-416 and the layers of inter-gate insulator material include layers 418-420. The inter-gate insulator material layer 420 may be arranged above a source line layer 422 (e.g., doped polysilicon) that may be arranged above a substrate 424 (e.g., a silicon substrate). In some cases, a first word line (WL1) may correspond with control gate layer 414, a second word line (WL0) may correspond with control gate layer 415, and a source-side select gate line (SGS) may correspond with control gate layer 416.

In one embodiment, within the memory hole a dielectric material 408 (e.g., oxide or a stack of dielectric layers, such as layers of $Al_2O_3$ and SiO2), a floating gate material 410 (e.g., polysilicon), a tunneling layer material 412 (e.g., a thin oxide), and a channel layer material 406 (e.g., undoped polysilicon) may be deposited within the memory hole and arranged in order to form the vertical NAND string. The tunneling layer material 412 may comprise a portion of a multi-layer dielectric stack such as an ONO dielectric stack, which includes alternating layers of silicon dioxide ("O") and silicon nitride ("N"). In some cases, a core material layer 404 (e.g., oxide) may be formed within the memory hole. In other cases, the core material layer 404 may be omitted. A bit line contact layer 402 may be formed at the top of the memory hole and connect to the channel layer material 406. The channel layer material 406 may connect to the source line layer 422 at the bottom of the memory hole. Thus, in this case, the bit line contact layer 402 connects to the vertical NAND string at the top of the memory hole and the source line contact layer 422 connects to the vertical NAND string at the bottom of the memory hole. In some embodiments, the floating gate material 410 may be replaced with a charge storage material or a charge trapping layer (e.g., silicon nitride).

Figure 4B:
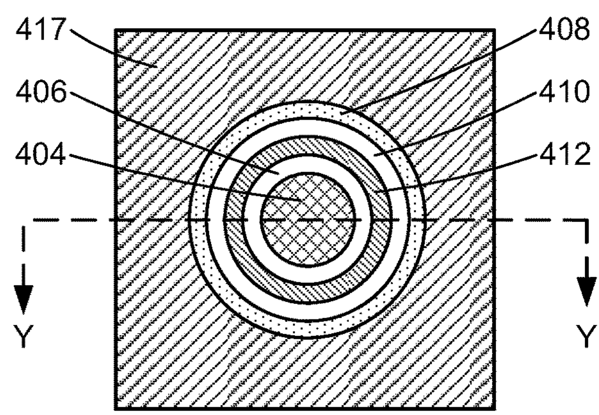
FIG. 4B depicts one embodiment of a cross-sectional view taken along line X-X of FIG. 4A.

FIG. 4B depicts one embodiment of a cross-sectional view taken along line X-X of FIG. 4A. As depicted, the vertical NAND string includes an inner core material layer 404 that is surrounded by the channel layer material 406 that is surrounded by the tunneling layer material 412 that is surrounded by the floating gate material 410 that is surrounded by the dielectric material 408 that is surrounded by the control gate material layer 417. In one embodiment, FIG. 4A may depict a cross-sectional view taken along line Y-Y of FIG. 4B. In one embodiment, the vertical NAND string may be formed using a vertical cylindrical structure or a vertical tapered cylindrical structure. In this case, the dielectric material 408, floating gate material 410, tunneling layer material 412, and channel layer material 406 of the vertical NAND string may comprise vertical annular structures surrounding the core material layer 404. In another embodiment, the vertical NAND string may be formed using a vertical pillar structure or a vertical rectangular prism structure.

Figure 5:
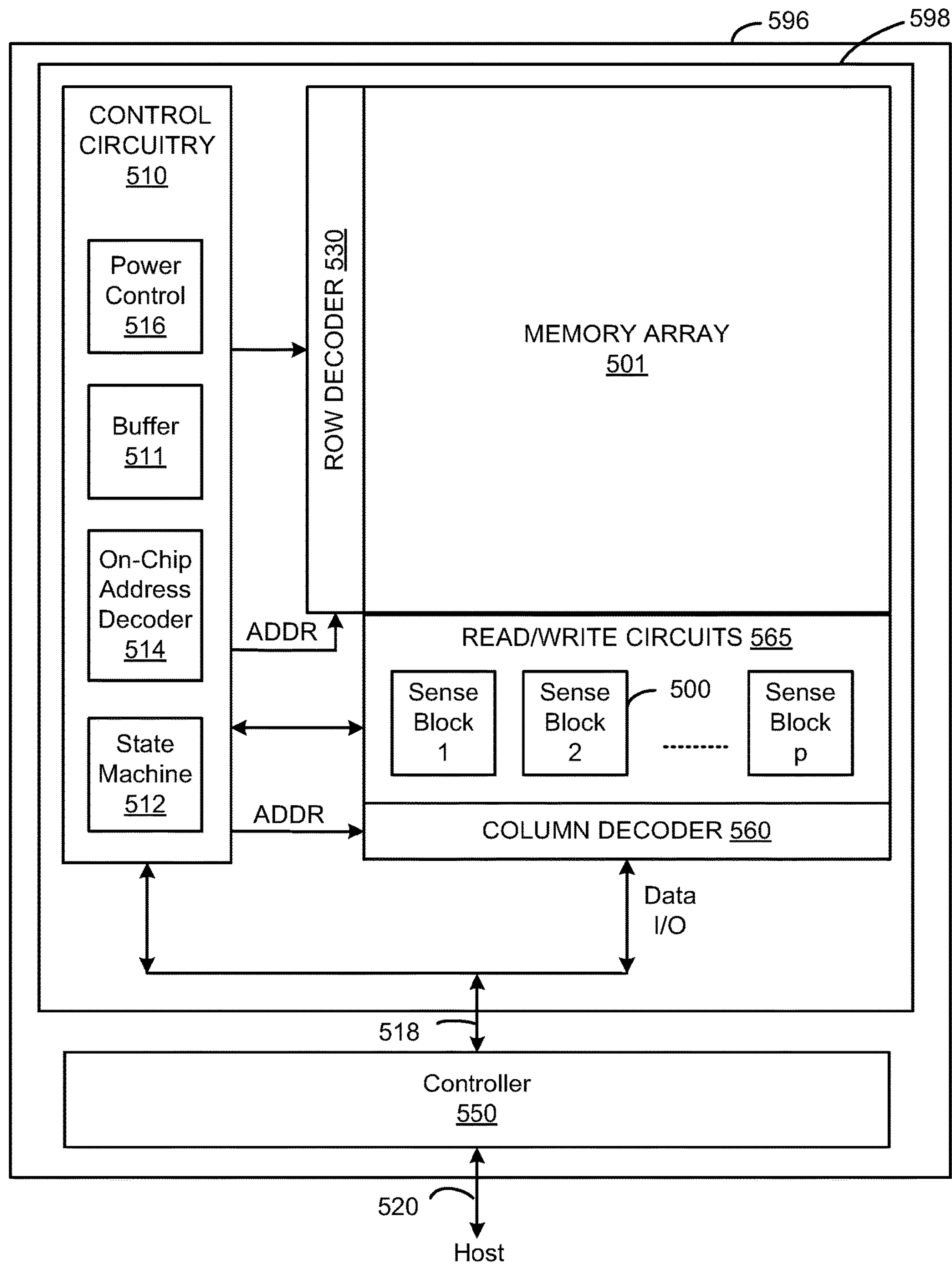
FIG. 5 depicts one embodiment of a non-volatile storage system.

FIG. 5 depicts one embodiment of a non-volatile storage system 596 including read/write circuits for reading and programming a page (or other unit) of memory cells (e.g., NAND multi-level cells) in parallel. As depicted, non-volatile storage system 596 includes a memory die 598 and controller 550. Memory die 598 includes a memory array 501 (e.g., a NAND flash memory array), control circuitry 510, row decoder 530, column decoder 560, and read/write circuits 565. In one embodiment, access to the memory array 501 by the various peripheral circuits (e.g., row decoders or column decoders) is implemented in a symmetric fashion, on opposite sides of the array, so that the densities of access lines and circuitry on each side are reduced by half. The memory array 501 is addressable by word lines via a row decoder 530 and by bit lines via a column decoder 560. Word lines and bit lines are examples of memory array control lines. The read/write circuits 565 include multiple sense blocks 500 that allow a page of storage elements to be read or programmed in parallel. In some cases, controller 550 may be integrated on the memory die 598. Commands and data are transferred between the host and controller 550 via lines 520 and between the controller 550 and the memory die 598 via lines 518.

In some cases, the controller 550 may work in conjunction with the control circuitry 510 to read and/or write data from the memory array 501. In one example, data to be written into the memory array 501 may be buffered by controller 550 and error correcting code (ECC) data may be generated corresponding with the data to be written. The ECC data, which allows data errors that occur during transmission or storage to be detected and/or corrected, may be written to the memory array 501 or stored in non-volatile memory within controller 550. In one embodiment, the ECC data may be generated and data errors may be corrected by circuitry within controller 550. The controller 550 may configure the control circuitry 510 to perform various memory operations on the memory array 501. In one example, a host may issue a programming command and in response, controller 550 may configure the control circuitry to perform a read operation (e.g., to read the sideband or overhead area located at the end of a page to confirm that the page has not been marked defective and can be written to) followed by a programming operation.

The control circuitry 510 configures the read/write circuits 565 to perform memory operations on the memory array 501. The control circuitry 510 includes a state machine 512, an on-chip address decoder 514, buffer 511, and a power control module 516. The buffer 511 may comprise an SRAM or a page register for storing one or more pages of data. The state machine 512 provides chip-level control of memory operations. In one example, state machine 512 may cause various voltages to be applied to control lines (e.g., selected word lines and unselected word lines) within the memory array 501 corresponding with a particular memory operation (e.g., a read or write operation). The state machine 512 may implement control logic for controlling read, write, or erase operations. The on-chip address decoder 514 provides an address interface between that used by the host or a memory controller to the hardware address used by the decoders 530 and 560. The power control module 516 controls the power and voltages supplied to the word lines and bit lines during memory operations. In one embodiment, a power control module 516 includes one or more charge pumps that may generate voltages greater than the supply voltage and one or more voltage regulators for generating various voltages, such as voltages used during programming, erase, and read operations.

In some embodiments, one or more of the components (alone or in combination), other than memory array 501, may be referred to as a managing or control circuit. For example, one or more managing or control circuits may include any one of or a combination of control circuitry 510, state machine 512, decoders 530/560, power control 516, sense blocks 500, buffer 511, read/write circuits 565, controller 550, and so forth. The one or more managing circuits may perform or facilitate one or more memory array operations including erasing, programming, or reading operations.

The memory die 598 may include a read circuit, a write circuit (or programming circuit), and an erase circuit. The read circuit, write circuit, and erase circuit may share components or circuitry in order to implement control logic for performing read, write, or erase operations on the memory array 501. The read circuit, write circuit, and erase circuit may be part of one or more managing circuits for facilitating one or more memory array operations including erasing, programming, or reading operations.

In one embodiment, memory array 501 may be divided into a large number of blocks (e.g., blocks 0-1023, or another amount) of memory cells. As is common for flash memory systems, the block may be the unit of erase. That is, each block may contain the minimum number of memory cells that are erased together. Other units of erase can also be used. A block contains a set of NAND strings which are accessed via bit lines and word lines. Typically, all of the NAND strings in a block share a common set of word lines.

Each block may be divided into a particular number of pages. In one embodiment, a page may be the unit of programming. Other units of programming can also be used. One or more pages of data are typically stored in one row of memory cells. For example, one or more pages of data may be stored in memory cells connected to a common word line. In one embodiment, the set of memory cells that are connected to a common word line are programmed simultaneously. A page can store one or more sectors. A sector may include user data and overhead data (also called system data). Overhead data typically includes header information and Error Correction Codes (ECC) that have been calculated from the user data of the sector. The controller (or other component) calculates the ECC when data is being programmed into the array, and also checks it when data is being read from the array. Alternatively, the ECC and/or other overhead data may be stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks, pages, and sectors can also be used.

Figure 6:
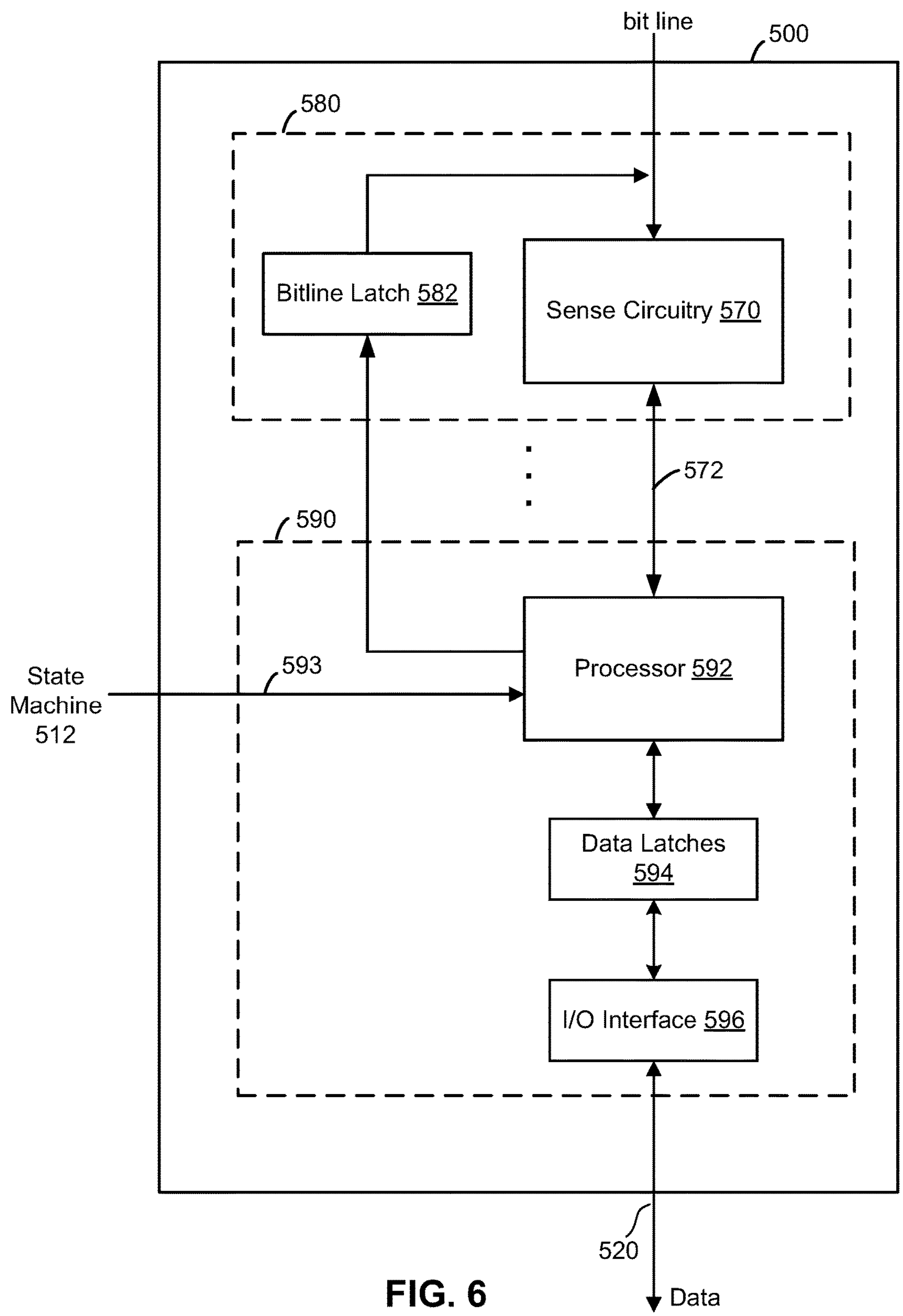
FIG. 6 depicts one embodiment of a sense block.

FIG. 6 depicts one embodiment of a sense block 500, such as sense block 500 in FIG. 5. An individual sense block 500 may be partitioned into a core portion, referred to as a sense module 580, and a common portion 590. In one embodiment, there is a separate sense module 580 for each bit line and one common portion 590 for a set of multiple sense modules 580. In one example, a sense block will include one common portion 590 and eight sense modules 580. Each of the sense modules in a group will communicate with the associated common portion via a data bus 572.

Sense module 580 comprises sense circuitry 570 that determines whether a conduction current in a connected bit line is above or below a predetermined threshold level. Sense module 580 also includes a bit line latch 582 that is used to set a voltage condition on the connected bit line. For example, a predetermined state latched in bit line latch 582 may result in the connected bit line being pulled to a state designating program inhibit voltage (e.g., 1.5-3 V).

Common portion 590 comprises a processor 592, a set of data latches 594, and an I/O Interface 596 coupled between the set of data latches 594 and data bus 520. Processor 592 performs computations. For example, processor 592 may determine the data stored in the sensed storage element and store the determined data in the set of data latches. The set of data latches 594 may be used to store data bits determined by processor 592 during a read operation or to store data bits imported from the data bus 520 during a program operation. The imported data bits represent write data meant to be programmed into a memory array, such as memory array 501 in FIG. 5. I/O interface 596 provides an interface between data latches 594 and the data bus 520.

During a read operation or other storage element sensing operation, a state machine, such as state machine 512 in FIG. 5, controls the supply of different control gate voltages to the addressed storage elements. As it steps through the various predefined control gate voltages corresponding to the various memory states supported by the memory, the sense module 580 may trip at one of these voltages and an output will be provided from sense module 580 to processor 592 via bus 572. At that point, processor 592 determines the resultant memory state by consideration of the tripping event(s) of the sense module and the information about the applied control gate voltage from the state machine via input lines 593. It then computes a binary encoding for the memory state and stores the resultant data bits into data latches 594. In another embodiment of the core portion, bit line latch 582 serves both as a latch for latching the output of the sense module 580 and as a bit line latch as described above.

During a programming operation, the data to be programmed is stored in the set of data latches 594. The programming operation, under the control of the state machine 512, comprises a series of programming voltage pulses applied to the control gates of the addressed storage elements. Each program pulse is followed by a read back (or verify process) to determine if the storage element has been programmed to the desired memory state. Processor 592 monitors the read back memory state relative to the desired memory state. When the two are in agreement, the processor 592 sets the bit line latch 582 so as to cause the bit line to be pulled to a state designating program inhibit voltage. This inhibits the storage element coupled to the bit line from further programming even if program pulses appear on its control gate. In other embodiments, the processor initially loads the bit line latch 582 and the sense circuitry sets it to an inhibit value during the verify process.

Data latch stack 594 contains a stack of data latches corresponding to the sense module. In one embodiment, there are three data latches per sense module 580. The data latches can be implemented as a shift register so that the parallel data stored therein is converted to serial data for data bus 520, and vice-versa. All the data latches corresponding to a read/write block can be linked together to form a block shift register so that a block of data can be input or output by serial transfer. In particular, the bank of read/write modules may be configured such that each of its set of data latches will shift data in to or out of the data bus in sequence as if they are part of a shift register for the entire read/write block.

Figure 7A:
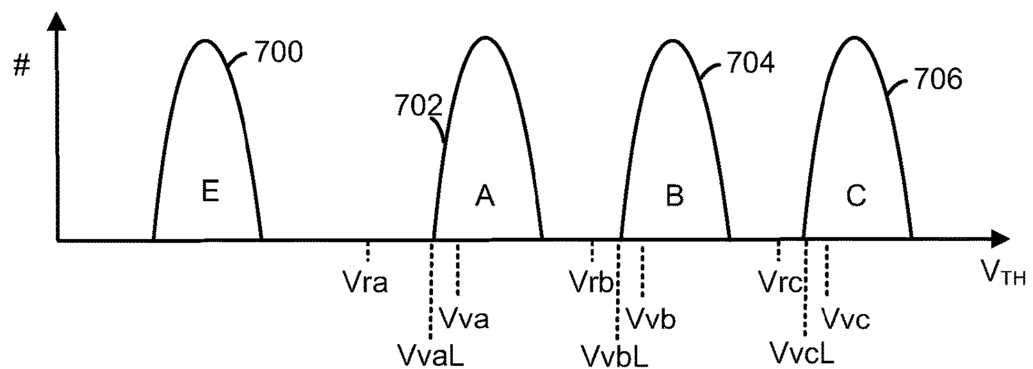
FIG. 7A depicts one embodiment of a set of threshold voltage distributions for a four-state memory device in which each storage element stores two bits of data.

FIG. 7A depicts one embodiment of a set of threshold voltage distributions for a four-state memory device in which each storage element stores two bits of data. A first threshold voltage (Vth) distribution 700 is provided for erased (E-state) storage elements. Three Vth distributions 702, 704 and 706 represent programmed states A, B and C, respectively. In one embodiment, the threshold voltages in the E-state and the threshold voltages in the A, B and C distributions are positive. In another embodiment, the threshold voltage distribution for the E-state is negative, while the threshold voltage distributions for the A-state, B-state and C-state distributions are positive.

Three read reference voltages, Vra, Vrb and Vrc, are also provided for reading data from storage elements. By testing whether the threshold voltage of a given storage element is above or below Vra, Vrb and Vrc, the system can determine the state, e.g., programming condition, the storage element is in.

Further, three verify reference voltages, Vva, Vvb and Vvc, are provided. When programming storage elements to the A-state, B-state or C-state, the system will test whether those storage elements have a threshold voltage greater than or equal to Vva, Vvb or Vvc, respectively.

In one embodiment, known as full sequence programming, storage elements can be programmed from the E-state directly to any of the programmed states A, B or C. For example, a population of storage elements to be programmed may first be erased so that all storage elements in the population are in the E-state. A series of program pulses, such as depicted in FIG. 7F, may then be used to program storage elements directly into states A, B or C. While some storage elements are being programmed from the E-state to the A-state, other storage elements are being programmed from the E-state to the B-state and/or from the E-state to the C-state.

Another option is to use low and high verify levels for one or more data states. For example, VvaL and Vva are lower and higher verify levels, respectively, for the A-state, VvbL and Vvb are lower and higher verify levels, respectively, for the B-state, and VvcL and Vvc are lower and higher verify levels, respectively, for the C-state. In some cases, VvcL is not used since reduced programming precision may be acceptable for the highest state. During programming, when the Vth of a storage element which is being programmed to the A-state as a target state exceeds VvaL, the programming speed of the storage element is slowed down, in a slow programming mode, such as by raising the associated bit line voltage to a level, e.g., 0.6-0.8 V, which is between a nominal program or non-inhibit level, e.g., 0 V and a full inhibit level, e.g., 4-6 V. This provides greater accuracy by avoiding large step increases in threshold voltage. When the Vth reaches Vva, the storage element is locked out from further programming. Similarly, when the Vth of a storage element which is being programmed to the B-state as a target state exceeds VvbL, the programming speed of the storage element is slowed down, and when the Vth reaches Vvb, the storage element is locked out from further programming. Optionally, when the Vth of a storage element which is being programmed to the C-state as a target state exceeds VvcL, the programming speed of the storage element is slowed down, and when the Vth reaches Vvc, the storage element is locked out from further programming. This programming technique has been referred to as a quick pass write or dual verify technique. Note that, in one approach, dual verify levels are not used for the highest state since some overshoot is typically acceptable for that state. Instead, the dual verify levels can be used for the programmed states, above the erased state, and below the highest state.

Figure 7B:
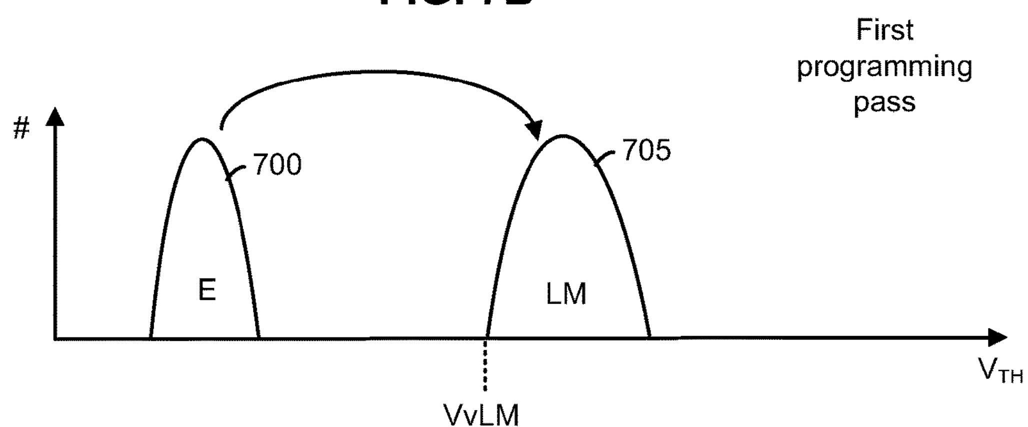
FIG. 7B depicts one embodiment of a first pass of a two-pass programming technique.

FIG. 7B depicts one embodiment of a first pass of a two-pass programming technique. In this example, a multi-state storage element stores data for two different pages: a lower page and an upper page. Four states are depicted by repeating the threshold voltage distributions 700, 702, 704 and 706 from FIG. 7A. These states, and the bits they represent, are: E-state (11), A-state (01), B-state (00) and C-state (10). For E-state, both pages store a "1." For A-state, the lower page stores a "1" and the upper page stores a "0." For B-state, both pages store "0." For C-state, the lower page stores "0" and the upper page stores "1." Note that although specific bit patterns have been assigned to each of the states, different bit patterns may also be assigned.

In the first programming pass, the lower page is programmed for a selected word line WLn. If the lower page is to remain data 1, then the storage element state remains at state E (distribution 700). If the data is to be programmed to 0, then the threshold voltage of the storage elements on WLn are raised such that the storage element is programmed to an intermediate (LM or lower-middle) state (distribution 705).

In one embodiment, after a storage element is programmed from the E-state to the LM-state, its neighbor storage element on an adjacent word line WLn+1 in the NAND string will then be programmed with respect to its lower page in a respective first programming pass of the adjacent word line.

Figure 7C:
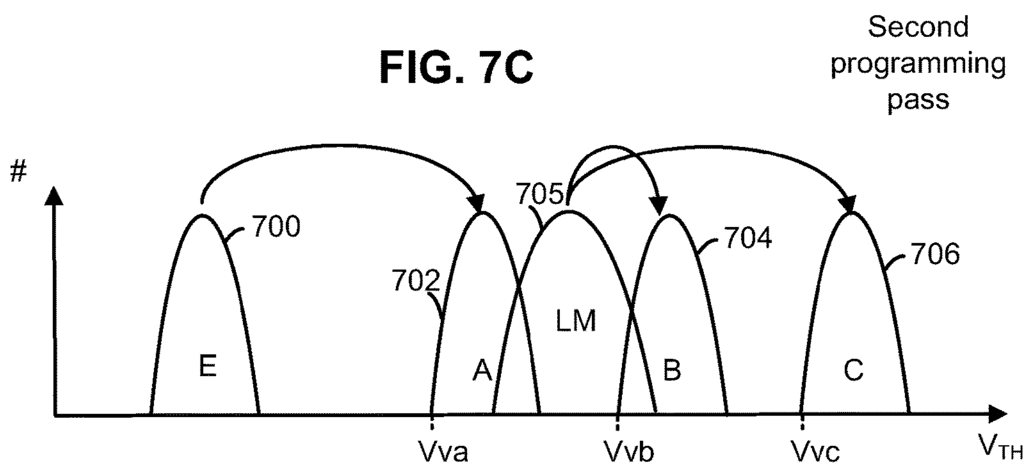
FIG. 7C depicts one embodiment of a second pass of the two-pass programming technique.

FIG. 7C depicts one embodiment of a second pass of the two-pass programming technique referred to in FIG. 7B. The A-state storage elements are programmed from the E-state distribution 700 to the A-state distribution 702, the B-state storage elements are programmed from the LM-state distribution 705 to the B-state distribution 704, and the C-state storage elements are programmed from the LM-state distribution 705 to the C-state distribution 706.

Figure 7D:
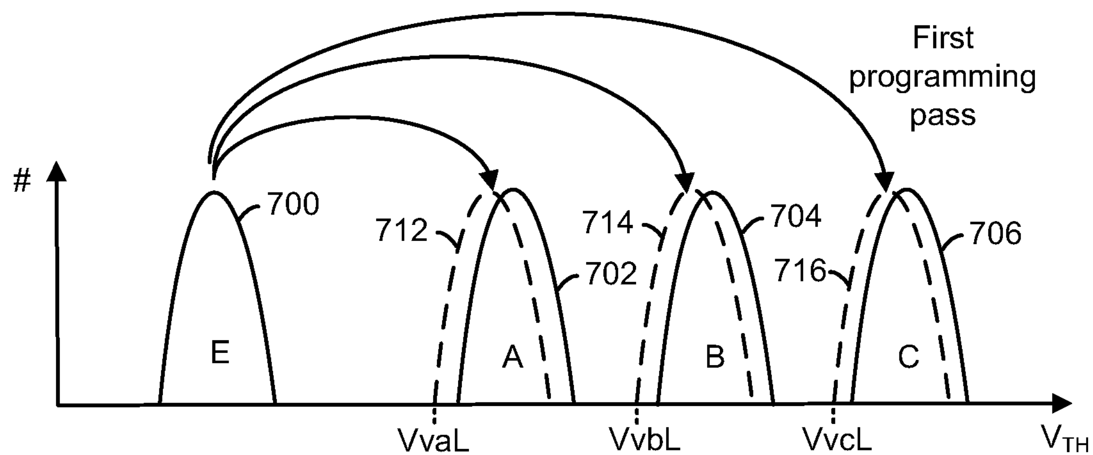
FIG. 7D depicts one embodiment of a first pass of another two-pass programming technique.

FIG. 7D depicts one embodiment of a first pass of another two-pass programming technique. In this example, referred to as foggy-fine (or course-fine) programming, the A-state, B-state and C-state storage elements are programmed from the E-state to distributions 712, 714 and 716, respectively, using lower verify levels VvaL, VvbL and VvcL, respectively. This is the foggy (or course) programming pass. A relatively large program voltage step size may be used, for instance, to quickly program the storage elements to the respective lower verify levels.

Figure 7E:
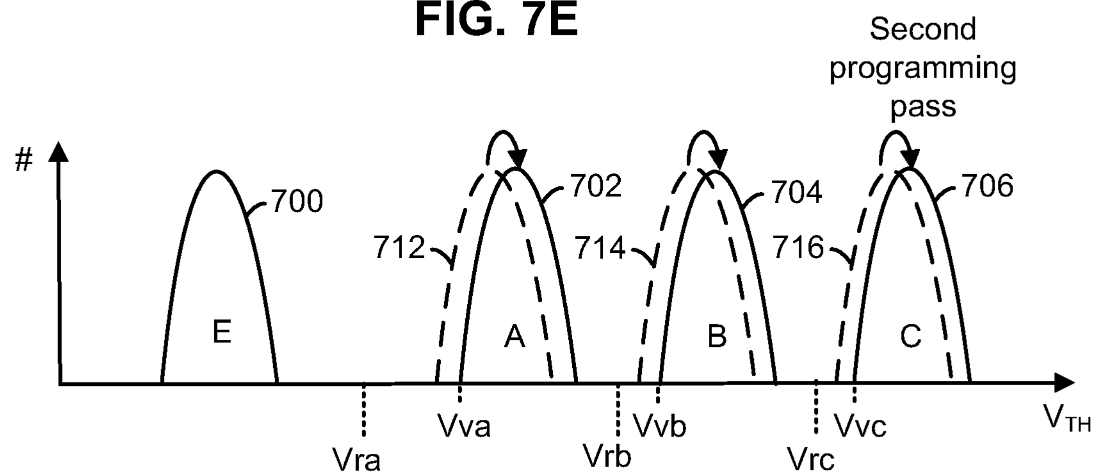
FIG. 7E depicts one embodiment of a second pass of the two-pass programming technique.
Figure 7F:
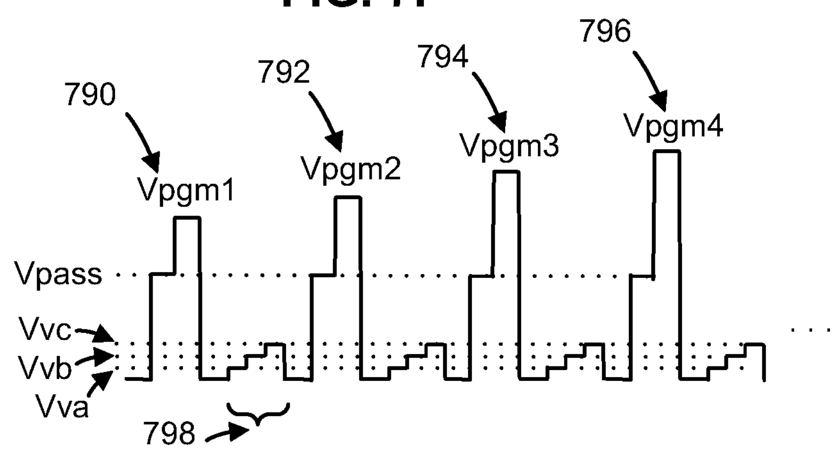
FIG. 7F depicts one embodiment of a series of program and verify pulses which are applied to a selected word line during a programming operation.

FIG. 7E depicts one embodiment of a second pass of the two-pass programming technique referred to in FIG. 7D. The A-state, B-state and C-state storage elements are programmed from the respective lower distributions to respective final distributions 702, 704 and 706, respectively, using the nominal, higher verify levels Vva, Vvb and Vvc, respectively. This is the fine programming pass. A relatively small program voltage step size may be used, for instance, to slowly program the storage elements to the respective final verify levels while avoiding a large overshoot.

Although the programming examples depict four data states and two pages of data, the concepts described herein may be applied to other implementations with more or fewer than four states and more or fewer than two pages. For example, memory devices may utilize eight or sixteen states per storage element. Moreover, in the example programming techniques discussed herein, the Vth of a storage element may be raised gradually as it is programmed to a target data state. However, programming techniques may be used in which the Vth of a storage element may be lowered gradually as it is programmed to a target data state. Programming techniques which measure storage element current may be used as well. The concepts described herein may be adapted to the different programming techniques.

FIG. 7F depicts one embodiment of a series of program and verify pulses which are applied to a selected word line during a programming operation. A programming operation may include multiple program-verify iterations, in which each iteration applies one or more programming voltages followed by one or more verify voltages to the selected word line. In one embodiment, the programming voltages applied in a previous iteration may be stepped up in successive iterations. Moreover, the one or more programming voltages applied during a programming iteration may include a first portion which has a pass voltage (Vpass) level, e.g., 6-8 V, followed by a second, highest amplitude portion at a program level, e.g., 12-25 V. For example, a first, second, third and fourth programming pulses 790, 792, 794 and 796 have program levels of Vpgm1, Vpgm2, Vpgm3 and Vpgm4, respectively. One or more verify pulses 798 associated with verify voltages Vva, Vvb and Vvc may be provided after each programming pulse. In some cases, one or more initial programming pulses are not followed by verify pulses because it is not expected that any storage elements have reached the lowest program state (e.g., A-state). Subsequently, in some cases, program iterations may use verify pulses for the A-state, followed by program iterations which use verify pulses for the A-states and B-states, followed by program iterations which use verify pulses for the B-states and C-states.

In one embodiment, a programming pulse may correspond with a voltage that is applied to a selected word line connected to a selected memory cell within a memory array during a programming operation that transitions from a first voltage (e.g., 0V) to an intermediate voltage (e.g., Vpass) then transitions from the intermediate voltage to a programming voltage (e.g., Vpgm1 or 15V). A program verify pulse may correspond with a voltage that is applied to a selected word line connected to a selected memory cell within a memory array during a program verify operation that transitions from a first voltage (e.g., 0V) to first verify voltage (e.g., Vva) and then transitions from the first verify voltage to a second verify voltage (e.g., Vvb).

Figure 8A:
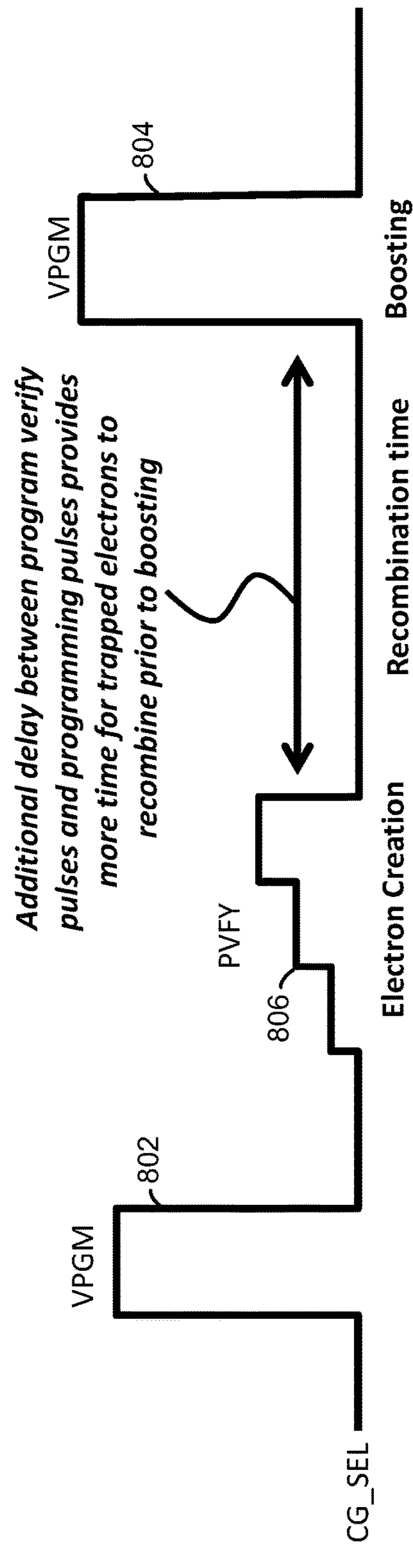
FIG. 8A depicts one embodiment of a voltage waveform applied to a selected word line within a memory array.

FIG. 8A depicts one embodiment of a voltage waveform applied to a selected word line within a memory array. The voltage waveform CG_SEL includes one or more programming pulses 802 for programming memory cells connected to the selected word line followed by one or more program verify pulses 806 for verifying memory states of the programmed memory cells followed by a second set of programming pulses 804. As depicted, a time delay between the one or more program verify pulses 806 and the second set of programming pulses 804 provides additional time for residual electrons to recombine prior to the second set of programming pulses 804 being applied to the selected word line. In one embodiment, the time delay may be set or adjusted based on a chip temperature (e.g., determined using a temperature sensor located on a memory die), a maximum programming voltage for the second set of programming pulses 804, and/or a number of programming pulses to be applied to the selected word line corresponding with the second set of programming pulses 804. In one example, the time delay may be set to 1 ms or 10 ms if the chip temperature is below 25 degrees Celsius. In another example, the time delay may be set to 0.5 ms or 2 ms if the maximum programming voltage for the second set of programming pulses 804 is greater than or equal to 9V. In some cases, as the programming voltage increases, the programming margin for reliably programming memory cells may reduce causing the number of programming errors due to residual electrons to increase. In another example, the time delay may be set to 200 μs or 800 μs if the number of programming pulses to be applied to the selected word line is greater than or equal to four programming pulses.

In some embodiments, the memory cells connected to the selected word line may comprise NAND Flash memory cells, floating gate transistors, charge trap transistors, SONOS devices, ReRAM memory cells, or phase change memory cells. The memory cells connected to the selected word line may comprise NAND memory cells with a polysilicon channel.

In one embodiment, the time delay between the one or more program verify pulses 806 and the second set of programming pulses 804 may be determined based on one or more criteria including a chip temperature, a programming loop count, a maximum programming voltage to be applied to the memory cells during a subsequent application of programming pulses, an average programming voltage to be applied to the memory cells during a subsequent application of programming pulses, and a number of programming pulses to be applied to the selected word line during a subsequent application of programming pulses.

In one embodiment, the time delay may be determined and/or generated using a delay circuit. The delay circuit may comprise a delay line and/or a state machine. In another embodiment, the time delay may be determined and/or generated using a control circuit that includes a state machine. In one example, the control circuit may take in a clock signal (e.g., from an on-chip clock oscillator) with a periodic clock period and generate the time delay using the clock signal (e.g., the time delay may comprise 50 clock periods).

Figure 8B:
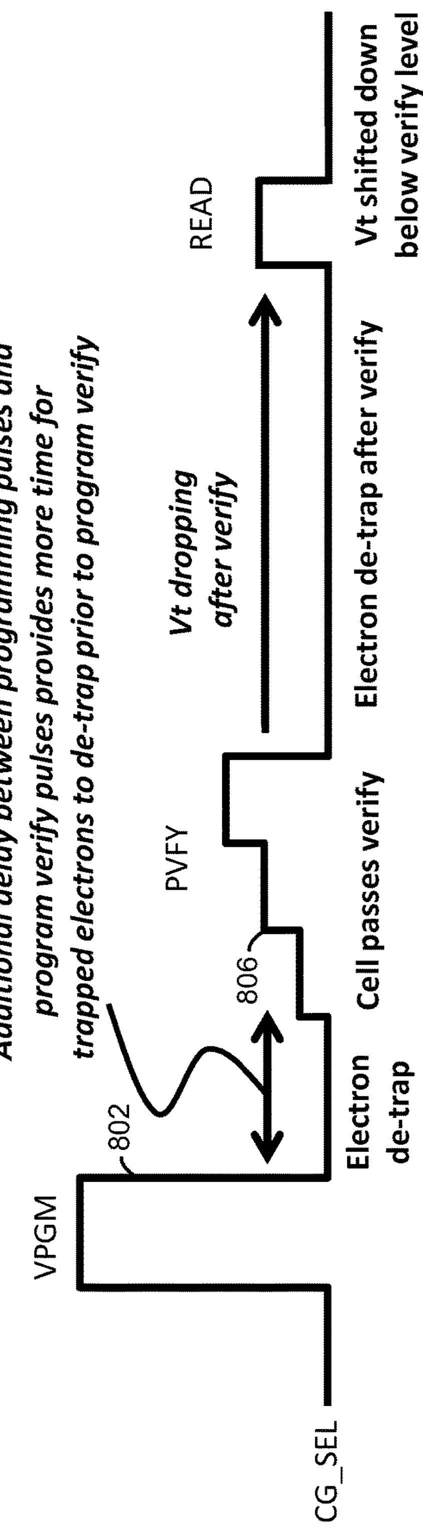
FIG. 8B depicts another embodiment of a voltage waveform applied to a selected word line within a memory array.

FIG. 8B depicts another embodiment of a voltage waveform applied to a selected word line within a memory array. The voltage waveform CG_SEL includes one or more programming pulses 802 for programming memory cells connected to the selected word line followed by one or more program verify pulses 806 for verifying memory states of the programmed memory cells followed by one or more read pulses 808 for determining data values stored within memory cells connected to the selected word line. In some cases, if the memory cells comprise charge trap transistors, then the reduction in transistor threshold voltage (Vt) due to de-trapped electrons that occurs prior to the one or more program verify pulses 806 may be compensated for as additional programming pulses may be performed if necessary.

As depicted in FIG. 8B, a time delay between the one or more programming pulses 802 and the one or more program verify pulses 806 provides additional time for trapped electrons to de-trap prior to application of the one or more program verify pulses 806. In one embodiment, the time delay may be set or adjusted based on a chip temperature (e.g., determined using a temperature sensor located on a memory die), a maximum programming voltage for the one or more programming pulses 802, and/or the number of programming pulses that were applied to the selected word line corresponding with the one or more programming pulses 802. In one example, the time delay may be set to 2 ms or 3 ms if the chip temperature is below 65 degrees Celsius. In another example, the time delay may be set to 0.5 ms or 2 ms if the maximum programming voltage for the one or more programming pulses 802 is greater than or equal to 17V. In some cases, as a programming voltage increases, the number of trapped electrons may increase. In another example, the time delay may be set to 400 μs or 700 μs if the number of programming pulses corresponding with the one or more programming pulses 802 is greater than or equal to two programming pulses.

Figure 8C:
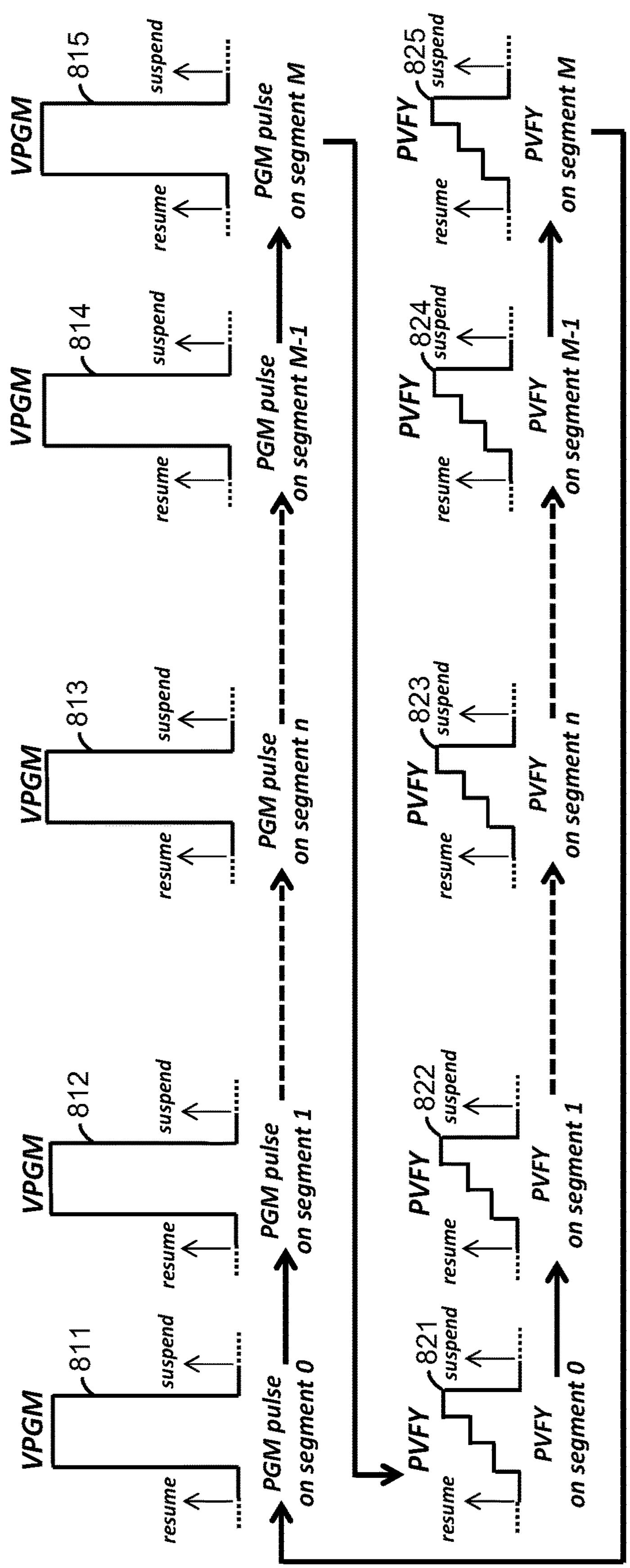
FIG. 8C depicts one embodiment of voltage waveforms applied to a memory system comprising a plurality of segments.

FIG. 8C depicts one embodiment of voltage waveforms applied to a memory system comprising a plurality of segments (or groupings of memory cells). The memory system may comprise M+1 segments and each segment (or grouping of memory cells) may correspond with a memory array, a set of memory arrays, a memory die, or a set of memory die. In some cases, a segment may correspond with the maximum programmable chunk of memory (e.g., limited by power constraints). To increase the system-level programming throughput of the memory system, the application of programming pulses and program verify pulses may be alternated between the different segments or groupings of memory cells.

As depicted, a first set of programming pulses 811 may be applied to a first segment (Segment 0) followed by a second set of programming pulses 812 being applied to a second segment (Segment 1) followed by a third set of programming pulses 813 being applied to a third segment (Segment n) followed by a fourth set of programming pulses 814 being applied to a fourth segment (Segment M−1) followed by a fifth set of programming pulses 815 being applied to a fifth segment (Segment M). After the fifth set of programming pulses 815 has been applied to the fifth segment, a first set of program verify pulses 821 is applied to the first segment followed by a second set of program verify pulses 822 being applied to the second segment followed by a third set of program verify pulses 823 applied to the third segment followed by a fourth set of program verify pulses 824 applied to the fourth segment followed by a fifth set of program verify pulses 825 applied to the fifth segment. After the fifth set of program verify pulses 825 has been applied to the fifth segment, additional programming pulses may be applied to the first segment again. Therefore, programming pulses corresponding with M total segments may be applied within the time delay between the application of the first set of programming pulses 811 to the first segment and the application of the first set of program verify pulses 821 to the first segment. Moreover, program verify pulses corresponding with M total segments may be applied within the time delay between the application of the first set of program verify pulses 821 and the additional programming pulses applied to the first segment.

In some embodiments, a first set of programming pulses and a first set of program verify pulses may be applied to a first segment prior to a second set of programming pulses and a second set of program verify pulses being applied to a second segment different from the first segment. In this case, the time delay between the first set of program verify pulses being applied to the first segment and subsequent programming pulses being applied to the first segment may be utilized by applying the second set of programming pulses in the second set of program verify pulses to the second segment.

In some cases, as program disturb may increase at higher programming voltages, the alternating pattern of applying programming pulses and program verify pulses to different segments depicted in FIG. 8C may be performed when a programming voltage reaches a particular programming voltage (e.g., is greater than or equal to 16V). In other cases, the alternating pattern of applying programming pulses and program verify pulses to different segments depicted in FIG. 8C may be performed when a chip temperature falls below a particular temperature threshold (e.g., falls below 45 degrees Celsius). In some cases, the alternating pattern of applying programming pulses and program verify pulses to different segments depicted in FIG. 8C may be performed when programming data during background operations (e.g., when the memory system is idle).

In some embodiments, each segment of a plurality of segments may be suspended from performing programming pulses and/or program verify pulses and then resumed on a periodic basis. In some cases, each segment of a plurality of segments may be suspended from performing programming pulses and/or program verify pulses and remain suspended until one or more other segments of the plurality of segments have completed performing one or more programming pulses and/or one or more program verify pulses. In this case, a suspended segment may be resumed after the one or more other segments have communicated to the suspended segment that the one or more programming pulses and/or one or more program verify pulses have been completed.

Figure 9A:
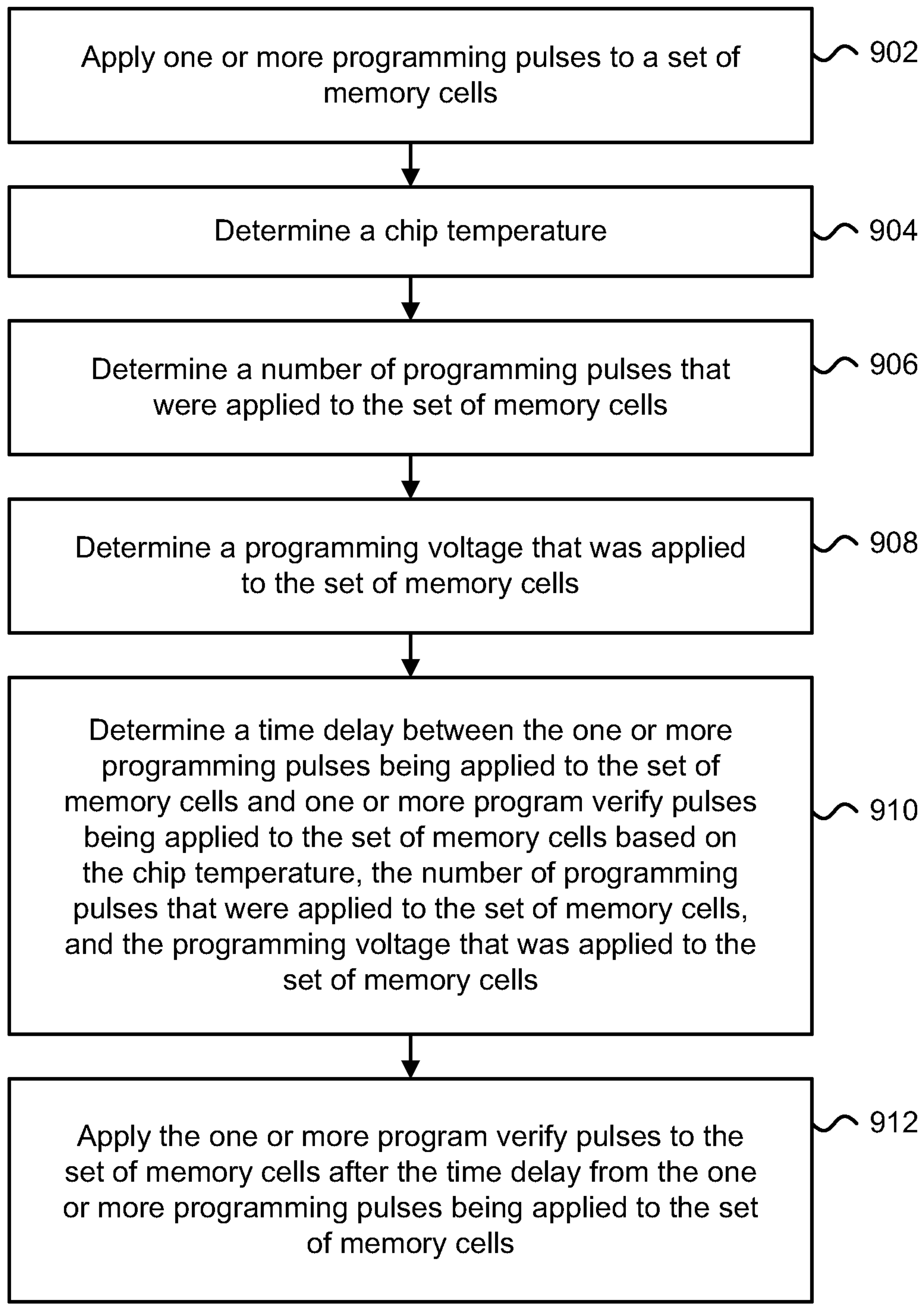
FIG. 9A is a flowchart describing one embodiment of a process for storing data within memory cells.

FIG. 9A is a flowchart describing one embodiment of a process for storing data within memory cells. In one embodiment, the process of FIG. 9A may be performed by a non-volatile storage system, such as non-volatile storage system 596 in FIG. 5.

In step 902, one or more programming pulses are applied to a set of memory cells. The set of memory cells may be connected to a selected word line within a memory array. The memory array may comprise vertical NAND structures or bit cost scalable (BiCS) NAND structures. The set of memory cells may comprise charge trap Flash transistors or floating gate transistors. The one or more programming pulses may comprise a first programming pulse at a first programming voltage (e.g., 11V). In step 904, a chip temperature is determined. In one example, the set of memory cells may be arranged on a memory die and the chip temperature may be determined using a temperature sensor arranged on the memory die. In step 906, a number of programming pulses that were applied to the set of memory cells is determined. The number of programming pulses may correspond with the total number of the one or more programming pulses that were applied to the set of memory cells in step 902.

In step 908, a programming voltage that was applied to the set of memory cells is determined. In one example, the programming voltage may correspond with the first programming voltage of the first programming pulse. In step 910, a time delay between the one or more programming pulses being applied to the set of memory cells and one or more program verify pulses being applied to the set of memory cells is determined based on the chip temperature, the number of programming pulses that were applied to the set of memory cells, and the programming voltage that was applied to the set of memory cells. In some embodiments, the time delay between the one or more programming pulses being applied to the set of memory cells and the one or more program verify pulses being applied to the set of memory cells may be determined based on the number of programming pulses that were applied to the set of memory cells and/or the programming voltage that was applied to the set of memory cells.

In other embodiments, the time delay between the one or more programming pulses being applied to the set of memory cells and the one or more program verify pulses being applied to the set of memory cells may be determined based on a chip temperature or a temperature associated with the set of memory cells. In step 912, the one or more program verify pulses are applied to the set of memory cells after the time delay from the one or more programming pulses being applied to the set of memory cells.

In one embodiment, the time delay may be determined based on a maximum programming voltage applied by the one or more programming pulses. In one example, if the maximum programming voltage was 17V, then the time delay may comprise 0.5 ms. In another example, if the maximum programming voltage was 19V, then the time delay may comprise 2 ms.

In one embodiment, the time delay may be determined based on a memory chip temperature. In one example, if the memory chip temperature is greater than 75 degrees Celsius, then the time delay may comprise 3.5 ms. In another example, if the memory chip temperature is less than 15 degrees Celsius, then the time delay may comprise 7 ms.

Figure 9B:
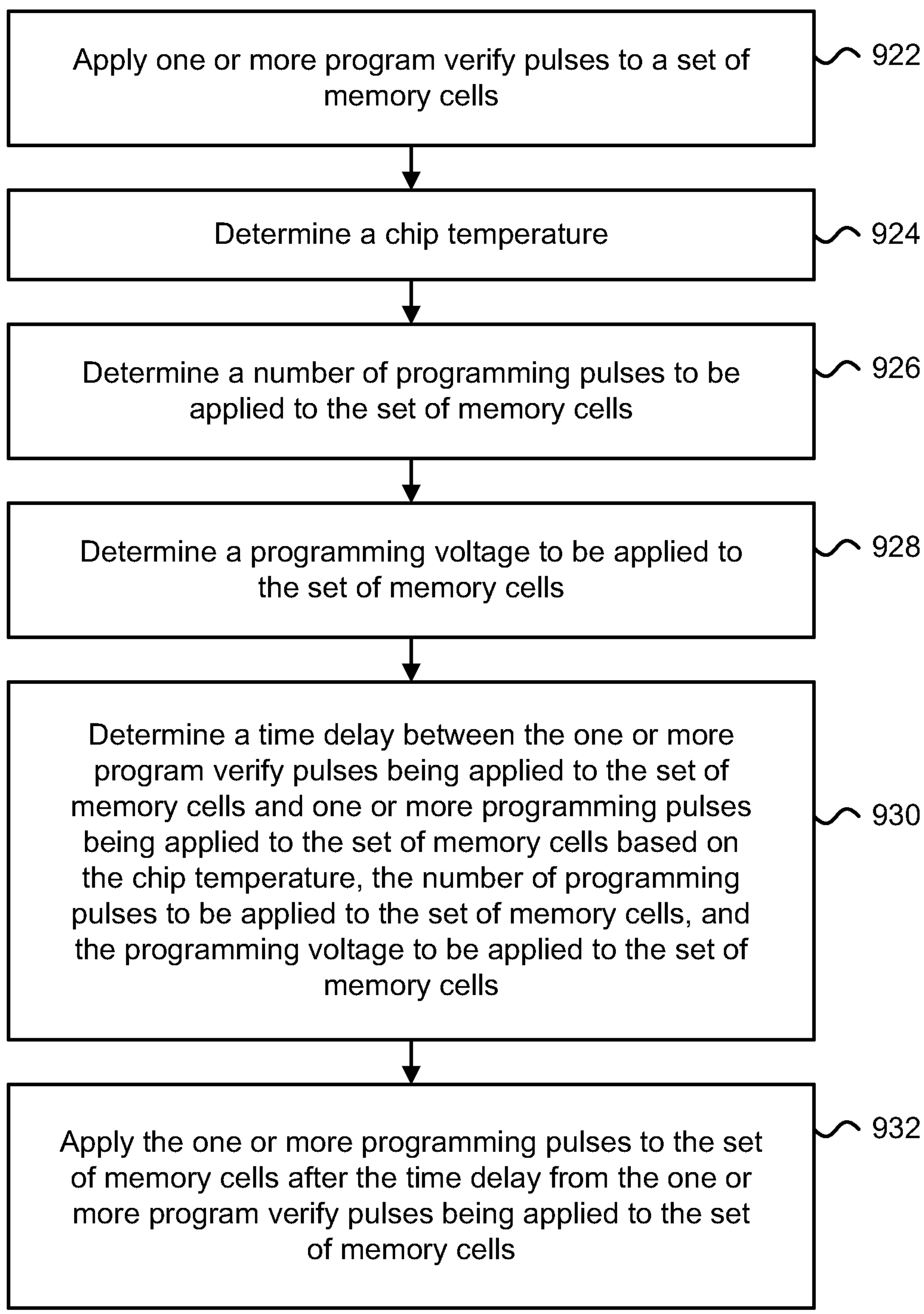
FIG. 9B is a flowchart describing another embodiment of a process for storing data within memory cells.

FIG. 9B is a flowchart describing another embodiment of a process for storing data within memory cells. In one embodiment, the process of FIG. 9B may be performed by a non-volatile storage system, such as non-volatile storage system 596 in FIG. 5.

In step 922, one or more program verify pulses are applied to a set of memory cells. The set of memory cells may be connected to a selected word line within a memory array. The memory array may comprise vertical NAND structures or bit cost scalable (BiCS) NAND structures. The set of memory cells may comprise charge trap Flash transistors or floating gate transistors. In step 924, a chip temperature is determined. In one example, the set of memory cells may be arranged on a memory die and the chip temperature may be determined using a temperature sensor arranged on the memory die. In step 926, a number of programming pulses to be applied to the set of memory cells is determined. The number of programming pulses may correspond with the total number of programming pulses to be subsequently applied to the set of memory cells.

In step 928, a programming voltage to be applied to the set of memory cells is determined. In one example, the programming voltage may correspond with the highest programming voltage to be subsequently applied to the set of memory cells. In step 930, a time delay between the one or more program verify pulses being applied to the set of memory cells and one or more programming pulses being applied to the set of memory cells is determined based on the chip temperature, the number of programming pulses to be applied to the set of memory cells, and the programming voltage to be applied to the set of memory cells. In some embodiments, time delay between the one or more program verify pulses being applied to the set of memory cells and one or more programming pulses being applied to the set of memory cells is determined based on the number of programming pulses to be applied to the set of memory cells and/or the programming voltage to be applied to the set of memory cells. In step 932, the one or more programming pulses are applied to the set of memory cells after the time delay from the one or more program verify pulses being applied to the set of memory cells.

One embodiment of the disclosed technology includes a memory array and a control circuit. The memory array includes a set of memory cells. The control circuit configured to apply one or more programming pulses to the set of memory cells. The one or more programming pulses includes a first programming pulse at a first voltage (e.g., the maximum voltage applied to the set of memory cells during the first programming pulse). The control circuit configured to determine a time delay between the one or more programming pulses being applied to the set of memory cells and one or more program verify pulses being applied to the set of memory cells based on the first voltage. The control circuit configured to apply the one or more program verify pulses to the set of memory cells after the time delay from the one or more programming pulses being applied to the set of memory cells.

One embodiment of the disclosed technology includes applying one or more programming pulses to a set of memory cells. The one or more programming pulses include a first programming pulse at a first voltage. The method further comprises determining a time delay between the one or more programming pulses being applied to the set of memory cells and one or more program verify pulses being applied to the set of memory cells based on the first voltage and applying the one or more program verify pulses to the set of memory cells after the time delay from the one or more programming pulses being applied to the set of memory cells.

One embodiment of the disclosed technology includes a memory array and a control circuit. The memory array including a set of memory cells. The control circuit configured to apply one or more program verify pulses to a set of memory cells and determine a programming voltage to be applied to the set of memory cells (e.g., the maximum voltage to be applied to the set of memory cell during one or more subsequent programming pulses). The control circuit configured to determine a time delay between the one or more program verify pulses being applied to the set of memory cells and one or more programming pulses being applied to the set of memory cells based on the programming voltage to be applied to the set of memory cells. The control circuit configured to apply the one or more programming pulses to the set of memory cells after the time delay from the one or more program verify pulses being applied to the set of memory cells.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments and do not necessarily refer to the same embodiment.

For purposes of this document, a connection may be a direct connection or an indirect connection (e.g., via another part). In some cases, when an element is referred to as being connected or coupled to another element, the element may be directly connected to the other element or indirectly connected to the other element via intervening elements. When an element is referred to as being directly connected to another element, then there are no intervening elements between the element and the other element.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A system, comprising:

a memory array including a set of memory cells;

a program circuit configured to apply one or more programming pulses to the set of memory cells and subsequent to one of the programming pulses apply one or more program verify pulses to the set of memory cells after a time delay, the one or more programming pulses includes a programming pulse at a programming voltage; and a delay circuit configured to determine the time delay between the one or more programming pulses and the one or more program verify pulses based on the programming voltage, the delay circuit configured to determine a second programming voltage different from the programming voltage to be applied to the set of memory cells and determine a second time delay between the one or more program verify pulses and the application of a second set of programming pulses to the set of memory cells based on the second programming voltage.

2. The system of claim 1, wherein:

the delay circuit configured to determine a chip temperature and determine the time delay based on the chip temperature.

3. The system of claim 1, wherein:

the delay circuit configured to determine a number of programming pulses that were applied to the set of memory cells and determine the time delay based on the number of programming pulses that were applied to the set of memory cells.

4. The system of claim 1, wherein:

the delay circuit configured to determine a programming loop count for the set of memory cells and determine the time delay based on the programming loop count.

5. The system of claim 1, wherein:

the delay circuit configured to determine the second time delay based on a chip temperature.

6. The system of claim 1, wherein:

the delay circuit configured to set the time delay to a first time delay if the chip temperature is below a temperature threshold and set the second time delay to a second time delay different from the first time delay if the chip temperature is below the temperature threshold.

7. The system of claim 1, wherein:

the program circuit configured to apply the second set of programming pulses to a second set of memory cells prior to the one or more program verify pulses being applied to the set of memory cells.

8. The system of claim 7, wherein:

the set of memory cells is arranged on a first memory die; and the second set of memory cells is arranged on a second memory die.

9. The system of claim 1, wherein:

the memory array comprises a non-volatile memory that is monolithically formed in one or more physical levels of memory cells having active areas disposed above a silicon substrate.

10. A method, comprising:

applying one or more programming pulses to a set of memory cells, the one or more programming pulses include a programming pulse at a programming voltage;

determining a time delay between the one or more programming pulses and one or more program verify pulses based on the programming voltage;

applying the one or more program verify pulses to the set of memory cells after the time delay;

determining a second programming voltage different from the programming voltage to be applied to the set of memory cells; and determining a second time delay between the one or more program verify pulses being applied to the set of memory cells and a second set of programming pulses being applied to the set of memory cells based on the second programming voltage.

11. The method of claim 10, further comprising:

determining a chip temperature, the determining the time delay includes determining the time delay based on the chip temperature.

12. The method of claim 10, further comprising:

determining a number of programming pulses that were applied to the set of memory cells, the determining the time delay includes determining the time delay based on the number of programming pulses that were applied to the set of memory cells.

13. The method of claim 10, further comprising:

determining a programming loop count for the set of memory cells, the determining the time delay includes determining the time delay based on the programming loop count.

14. The method of claim 10, further comprising:

applying the second set of programming pulses to a second set of memory cells prior to the one or more program verify pulses being applied to the set of memory cells.

15. The method of claim 14, wherein:

the set of memory cells is arranged on a first memory die; and the second set of memory cells is arranged on a second memory die.

16. An apparatus, comprising:

a memory array including a set of memory cells;

a program circuit configured to apply a first programming pulse to the set of memory cells and apply a first program verify pulse to the set of memory cells after a first time delay from application of the first programming pulse to the set of memory cells, the program circuit configured to apply a second programming pulse to the set of memory cells and apply a second program verify pulse to the set of memory cells after a second time delay from application of the second programming pulse, the second programming pulse is greater than the first programming pulse, the second time delay is greater than the first time delay; and a delay circuit configured to determine a chip temperature, the delay circuit configured to determine the first time delay based on a magnitude of the first programming pulse and the chip temperature, the delay circuit configured to determine the second time delay based on a magnitude of the second programming pulse and the chip temperature, the delay circuit configured to determine a second programming voltage corresponding with the second programming pulse and determine a third time delay between the first program verify pulse and the application of the second programming pulse based on the second programming voltage.

* * * * *